United States Patent [19]

Husson, Jr. et al.

[11] Patent Number: 5,789,757
[45] Date of Patent: Aug. 4, 1998

[54] MALEMIDE CONTAINING FORMULATIONS AND USES THEREFOR

[75] Inventors: Frank D. Husson, Jr., San Diego; Benjamin Neff, Chula Vista, both of Calif.

[73] Assignee: The Dexter Corporation, Windsor Locks, Conn.

[21] Appl. No.: 711,982

[22] Filed: Sep. 10, 1996

[51] Int. Cl.$^6$ ........................................... C09K 3/00
[52] U.S. Cl. ........................................... 252/183.11
[58] Field of Search .................................. 548/548, 549; 252/183.11; 526/262, 263; 428/473.5

[56] References Cited

U.S. PATENT DOCUMENTS

| | | | |
|---|---|---|---|
| 4,110,364 | 8/1978 | Gaku et al. | 528/170 |
| 4,179,551 | 12/1979 | Jones et al. | 526/262 |
| 4,700,473 | 10/1987 | Freyman et al. | 29/846 |
| 4,826,997 | 5/1989 | Kirchhoff | 548/546 |
| 4,873,116 | 10/1989 | Ancker | 428/36.9 |
| 4,876,153 | 10/1989 | Thorfinnson | 428/447 |
| 4,876,358 | 10/1989 | Alexander | 548/521 |
| 4,908,088 | 3/1990 | Boyd et al. | 156/307.3 |
| 4,914,814 | 4/1990 | Behun et al. | 29/843 |
| 5,006,673 | 4/1991 | Freyman et al. | 174/255 |
| 5,011,066 | 4/1991 | Thompson | 228/180.2 |
| 5,183,869 | 2/1993 | Kramer et al. | 526/262 |
| 5,186,383 | 2/1993 | Melton et al. | 228/180.2 |
| 5,189,116 | 2/1993 | Boyd et al. | 525/423 |
| 5,216,278 | 6/1993 | Lin et al. | 257/688 |
| 5,252,355 | 10/1993 | Ando et al. | 427/98 |
| 5,314,513 | 5/1994 | Miller et al. | 51/295 |
| 5,359,020 | 10/1994 | Brunner et al. | 526/262 |
| 5,405,686 | 4/1995 | Portelli et al. | 428/229 |
| 5,442,039 | 8/1995 | Hefner, Jr. et al. | 528/422 |
| 5,470,920 | 11/1995 | Camberlin et al. | 525/421 |
| 5,527,592 | 6/1996 | Afzali-Ardkani et al. | 428/209 |
| 5,599,611 | 2/1997 | Afzali-Ardkani et al. | 442/180 |

OTHER PUBLICATIONS

Bard and Brady, "A New Moisture Resistent Liquid Encapsulant" *42$^{nd}$ Electronic Components & Technology Conference* 1018–1022 (1992).

Hall, R. J., "Quality Assurance Specifications and Test Methods for Choosing A Solder Mask" *Surface Mount Int'l Conf. and Expo. Proc. Tech. Prog.* 939–943 (1993).

Johnson, M., "Why Use a Wet–Dry Solder Mask?" *Printed Circuit Fabrication* 13(10): 74,76,78,80 (1990).

Pennisi and Gold, "A New Liquid Encapsulant for IC Packaging" *42$^{nd}$ Electronic Components & Technology Conference* 1015–1017 (1992).

Romenesko, B. M., "Ball Grid Array And Flip Chip Technologies: Their Histories and Prospects" *The International Society for Hybrid Microelectronics* 19(1):64–74 (1996).

Stone, D. E., "Derailing the Cost Drivers" *Printed Circuit Fabrication* 17(12):16–18 (1994).

*Primary Examiner*—Charles T. Jordan
*Assistant Examiner*—John R. Hardee
*Attorney, Agent, or Firm*—Gray Cary Ware & Freidenrich; Stephen E. Reiter

[57] ABSTRACT

In accordance with the present invention, there are provided novel compositions based on a defined maleimide moiety. Invention compositions have excellent moisture resistance (and, hence are much less prone to give rise to "popcorning"), excellent handling properties (i.e., generally existing as a fluid material which does not require the addition of solvent to facilitate the use thereof), and excellent performance properties (e.g., good dielectric properties).

15 Claims, No Drawings

MALEMIDE CONTAINING FORMULATIONS AND USES THEREFOR

FIELD OF THE INVENTION

The present invention relates to formulations useful in a variety of applications related to the preparation of components employed in the electronics industry. In a particular aspect, the present invention relates to formulations useful for the preparation of laminates. In another aspect, the present invention relates to formulations useful for the preparation of solder masks. In yet another aspect, the present invention relates to formulations useful for the preparation of liquid encapsulant for electronic components. In still another aspect, the present invention relates to formulations useful for the preparation of non-hermetic electronic packages.

BACKGROUND OF THE INVENTION

As the electronics industry advances, and production of light weight components increases, the development of new materials gives producers increased options for further improving the performance and ease of manufacture of such components. Materials used in the manufacture of electronic components include the resin required for the preparation of prepregs (which are, in turn, used for the preparation of multilayered printed circuit boards and printed wiring boards), resins used for the preparation of solder masks (which define solder areas on the multilayered printed wiring board), and resins used for preparation of glob top (which protects microelectronic devices from the environment).

Multilayered printed circuit boards are currently produced mainly by (a) a mass laminating technique and (b) a pin laminating technique. In these techniques, a printed circuit board for inner layer use (hereinafter, referred to as "inner-layer board") is first manufactured. This inner-layer board is combined with prepregs and then a copper foil or a single-side copper-clad laminate and the superposed laminating materials are laminated to give a multilayered board, both sides of which are constituted by a copper foil. This multilayered structure is subjected to processing steps such as steps for forming through-holes, outer-layer printed circuits, etc.

The initial manufacture of resins used in laminates is usually conducted by chemical producers and supplied to the trade in a workable form. Addition of a curing agent or catalyst, as well as optional components such as diluents, flow promoters, fire retardants, and other modifying resins is performed by the user. This may be done in the interest of customization to the application or to ensure that pre-reaction of the formulation does not occur.

The catalyzed resin system is placed into a dip tank in which the glass cloth is immersed. The wet-coated cloth is squeezed between metering rolls to leave a measured amount of the resin system. Then it passes into a tunnel drier to remove any volatile materials (e.g., solvent if present) and usually to react the resin to a predetermined molecular weight. This ensures the proper amount of flow during lamination.

After the coated cloth has passed through the tunnel drier, the resin is high enough in $T_g$ to permit handling. At this stage, it is called prepreg; it can be cut into sheets or stored in roll form. Storage is often at room temperature, although some formulations require refrigeration.

Cut to size, sheets of prepreg are stacked between polished steel plates for placement in a laminating press. If printed circuits are to be made from the cured stock, copper foil is placed at the two surfaces of the stack. Otherwise, separator sheets or lubricants ensure removal of the plates from the cured laminate.

The conditions under which cure takes place vary with the resin type, thickness of the laminate, and other factors. Resin cure might be carried out, for example, at 175° C., from 250 to 1,000 psi, and for 30 to 60 minutes at temperature, followed by cooling. Certain resins (e.g., heat-resistant polymers) may require 200° C. or more for complete cure. Since steam-heated presses do not operate well above 175° C., frequently a partial cure is effected at this temperature and the remainder carried out in an oven at the higher temperature. Warpage is a definite possibility under such a procedure. Control of dimensional stability of laminate material and stability of assembled boards are both becoming more important, and the trend is toward higher $T_g$ resin material, laminated in a vacuum process to meet the fabrication-tolerance requirements and to reduce moisture absorption.

The behavior of high-reliability printed-circuit laminates may be improved by the addition of silane couplers to the resin materials employed for preparation of laminate. While the addition of couplers is intended to permit the resulting composites to be used in uncontrolled environments, many prior art materials appear to fail under certain conditions of high humidity and voltage stress. The result is the creation of copper-shorting filament plated along the glass surface. These may penetrate from one circuit element to another. Because the accelerating factors for this phenomenon are ionic contamination, humidity, voltage, and temperature, the chief test for suitability of the selected resin material and coupler for the intended use is the electrical resistance between interconnection lines or holes under voltage stress at high humidity.

When performing as intended, the coupler bonds the glass and cured resin strongly so that they act as a composite, although with anisotropic mechanical properties. Residual stresses in this composite affect the dimensional stability thereof. One source of these stresses is the glass fabric itself. The warp (machine direction) strands are flattened by tension during the impregnation process, while the crimp of the fill fibers is actually increased. Both are flattened during lamination. Repeat pressing raises the cured resin above its $T_g$; the softened material allows the glass fibers to relax, changing dimension. Temperature variation across the surface of the laminate during cure, resin flow to fill around elements in already circuitized substrates, as well as hole drilling; all create stress-induced dimensional change. Cross orienting alternate plies of the glass cloth can compensate glass-cloth tension, but in most cases, tracking such factors is not straightforward.

As a consequence, detailed correlation is lacking between dimensional change and the factors most predictive models assume for deformation; orthotopic contraction, warp, twist, and other high-order strain functions. Nonetheless, general effects are discernible, and the complex sequence of processes used to make multilayer boards is monitored and controlled based on computer predictive models derived from highly precise measurement techniques. This assures that the element in each layer will register to the others in the composite. Because moisture and temperature affect dimensions significantly compared with the factors discussed, prepregs, cores, and subcomposites are often temperature and humidity stabilized at critical process steps.

Another common use of resins in the electronics industry is for the preparation of solder masks. Solder mask is used to prevent excessive flow of solder in plastic packages. The material used must maintain the integrity of the physical, chemical, mechanical and environmentally related properties of the package. Solder masks were originally intended to be used on printed wiring boards (PWBs) as an aid to manufacturing, reducing the need for touch-up after machine soldering, reducing solder consumption, and providing mechanical protection for the main portion of the circuitry.

The main type of solder mask employed in the art is the "liquid photoimageable" solder mask. There are three primary methods of applying this type of soldermask: flood screen-coating, curtain and spray coating. Each method has both advantages and drawbacks. Screen coating, for example, is efficient in material usage, but through-holes may be plugged in the process. These holes must then be vacated during development. Curtain coating is also efficient, but it is also a much slower process due to the fact that only one side of a board can be coated at a time. Spray coating is the best method to accomplish complete fill and trace application, but this technique can result in substantial material losses (e.g., in the range of 10–30% waste).

Another common use of resins in the electronics industry is as a liquid encapsulant (also referred to as "glob top"), wherein an aliquot of resin material is used to encase a component to protect it from certain stresses and from exposure to the environment. To meet the industry's ever-increasing demand for device reliability, materials for encapsulant applications must meet increasingly stringent property requirements. Such requirements include excellent moisture resistance, ionic purity, low dielectric constant and good thermal properties. In the absence of these properties, especially in the presence of moisture and ionic impurities, corrosion (and ultimately failure of the device) will likely occur.

Yet another common use of resins in the electronics industry is in the preparation of non-hermetic electronic packages. Examples of such packages are ball grid array (BGA) assemblies, super ball grid arrays, IC memory cards, chip carriers, hybrid circuits, chip-on-board, multi-chip modules, pin grid arrays, and the like. In these structures, moisture resistance is an important consideration, both in terms of handling during assembly and reliability of the finished part. For example, absorption of moisture during assembly frequently leads to "popcorning" (the sometimes violent release of absorbed moisture upon heating to solder reflow temperatures). Accordingly, the development of moisture resistant resins for use in the preparation of non-hermetic electronic packages would be of great benefit to the art.

Accordingly, what is still needed in the art are materials which have good workability properties (e.g., fluid under typical processing conditions) and good performance properties (e.g., good adhesion, moisture resistance, etc.).

BRIEF DESCRIPTION OF THE INVENTION

In accordance with the present invention, it has been discovered that compositions based on a defined maleimide moiety have excellent moisture resistance (and, hence are much less prone to give rise to "popcorning"), excellent handling properties (i.e., generally existing as a fluid material which does not require the addition of solvent to facilitate the use thereof), and excellent performance properties (e.g., good dielectric properties).

DETAILED DESCRIPTION OF THE INVENTION

In accordance with the present invention, there are provided thermosetting resin compositions comprising a base formulation comprising:

(a) a maleimide;
(b) in the range of 0.2 up to 5 wt. % of at least one curing catalyst, based on the total weight of the composition; and
(c) optionally, at least one polycyanate ester monomer.

Maleimides contemplated for use in the practice of the present invention have the structure:

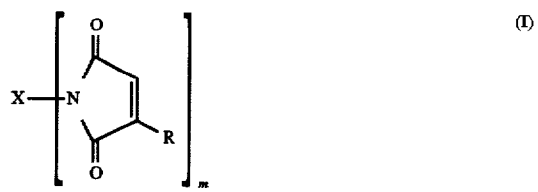

wherein:

m=1, 2 or 3, each R is independently selected from hydrogen or lower alkyl, and

X is a monovalent or polyvalent radical selected from:
branched chain alkyl, alkylene or alkylene oxide species having from about 12 to about 500 carbon atoms,
aromatic groups having the structure:

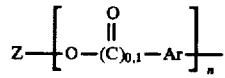

wherein:

n=1, 2 or 3, each Ar is a monovalent, divalent or trivalent aromatic, substituted aromatic, heteroaromatic or substituted heteroaromatic ring having in the range of 3 up to 10 carbon atoms, and Z is a branched chain alkyl, alkylene or alkylene oxide species having from about 12 to about 500 atoms in the backbone thereof, siloxanes having the structure:

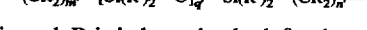

wherein each R is independently defined as above, and each R' is independently selected from hydrogen, lower alkyl or aryl, m' falls in the range of 1 up to 10, n' falls in the range of 1 up to 10, and q' falls in the range of 1 up to 50, or mixtures thereof.

Invention compositions are noteworthy for their excellent handling properties. Such compositions have desirably low viscosities which facilitate dispense operations. Typical viscosities fall in the range of about 10 up to about 12,000 centipoise, with viscosities in the range of about 10 up to about 2,000 centipoise being presently preferred.

With respect to the maleimide component of invention composition, presently preferred compounds for use herein are those wherein X is an alkylene or alkylene oxide species having from about 20 to about 100 carbon atoms. Especially preferred compounds are those wherein X is a 10,11-dioctyl-1,20-eicosyl radical.

When polycyanate esters are included in invention compositions, compounds having the structure II, as set forth below, are contemplated for use herein:

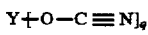 (II)

wherein:

q is 1, 2 or 3,

Y is selected from:
saturated straight chain or branched chain fluorinated alkyl, fluorinated alkylene or fluorinated alkylene oxide, optionally containing fluorinated saturated cyclic moieties as substituents on said alkyl, alkylene or alkylene oxide chain or as part of the backbone of the alkyl, alkylene or alkylene oxide chain, wherein said alkyl, alkylene or alkylene oxide species have at least 6 carbon atoms, preferably wherein said alkyl, alkylene or alkylene oxide species are high molecular weight branched chain species having from about 12 to about 500 carbon atoms, aromatic moieties having the structure:

   (III)

wherein each Ar is independently as defined above, Q is alkylene, fluorinated alkylene, cycloalkylene, fluorinated cycloalkylene, bicycloalkylene or fluorinated bicycloalkylene, r falls in the range of 0 up to 6 and v is 1, 2 or 3, as well as mixtures of any two or more thereof.

Presently preferred polycyanate esters employed in the practice of the present invention are hydrophobic compounds of structure II, wherein Y is:

   (III)

wherein each Ar is a monovalent or divalent phenyl or substituted phenyl ring, Q is alkylene, cycloalkylene or bicycloalkylene, r is 0, 1 or 2 and v is 2.

Cyanate ester monomers that can be employed in the practice of the present invention contain two or more ring forming cyanate (—O—C≡N) groups which cyclotrimerize to form substituted triazine rings upon heating. Because no leaving groups or volatile byproducts are formed during curing of the cyanate ester monomer, the curing reaction is referred to as addition polymerization. Suitable polycyanate ester monomers that may be used in the practice of the present invention include, for example, 1,1-bis(4-cyanatophenyl)methane, 1,1-bis(4-cyanatophenyl)ethane, 2,2-bis(4-cyanatophenyl)propane, 1,3-bis[2-(4-cyanatophenyl)propyl]benzene, the cyanate ester of dicyclopentadiene phenol novolac, 1,1-bis(2,6-dimethyl-4-cyanatophenyl)methane, and the like. Polycyanate ester monomers utilized in accordance with the present invention may be readily prepared by reacting appropriate dihydric phenols with a cyanogen halide in the presence of an acid acceptor.

As readily recognized by those of skill in the art, a wide variety of curing catalysts can be employed in the preparation of invention compositions. The preferred catalyst to be used will, of course, depend on the monomer vehicle employed. For example, for those monomer vehicles which cure by a free radical mechanism, free radical initiators such as peroxy esters, peroxy carbonates, hydroperoxides, alkylperoxides, arylperoxides, azo compounds, and the like can be employed.

For those monomer vehicles which cure by cationic and/or anionic polymerization, organic bases, cationic catalysts, transition metal catalysts, and the like can be employed. Exemplary organic bases contemplated for use herein include tertiary amines (e.g., N,N-dimethyl aniline, N,N-dimethyl toluidine, N,N-dimethyl-p-anisidine, p-halogeno-N,N-dimethyl anilines, 2-N-ethyl aniline ethanol, tri-n-butyl amine, pyridine, quinoline, N-methyl morpholine, triethanolamine, and the like); imidazoles (e.g.,
imidazole or benzimidazole); phenols (e.g., phenol, cresol, xylenol, resorcinol, phloroglucin, and the like), and the like.

Exemplary cationic catalysts contemplated for use herein include onium salts, iodonium salts, sulfonium salts, and the like.

Exemplary transition metal catalysts contemplated for use herein include lead, zinc, tin, manganese, nickel, copper, cobalt and the like, in the form of a chelate, a soap, or the like. Examples of such compounds include lead naphthenate, lead stearate, zinc naphthenate, tin oleate, dibutyl tin maleate, manganese naphthenate, cobalt naphthenate, lead salt of resin acid, chlorides such as $ZnCl_2$, $SnCl_4$ or $AlCl_3$, and the like.

In another aspect, invention compositions can optionally further contain one or more of the following additional components: anti-oxidants, bleed control agents, one or more fillers, inert (i.e., nonreactive) diluents, reactive diluents, coupling agents, adhesion promoters, flexibilizers, dyes, pigments, and the like.

Anti-oxidants contemplated for use in the practice of the present invention include hindered phenols (e.g., BHT (butylated hydroxytoluene), BHA (butylated hydroxyanisole), TBHQ (tertiary-butyl hydroquinone), 2,2'-methylenebis (6-tertiarybutyl-p-cresol), and the like), hindered amines (e.g., diphenylamine, N,N'-bis(1,4-dimethylpentyl-p-phenylene diamine, N-(4-anilinophenyl) methacrylamide, 4,4'-bis(α,α-dimethylbenzyl) diphenylamine, and the like), phosphites, and the like. When used, the quantity of anti-oxidant typically falls in the range of about 100 up to 2000 ppm, relative to the weight of the base formulation.

Anti-bleed agents contemplated for use in the practice of the present invention include cationic surfactants, tertiary amines, tertiary phosphines, amphoteric surfactants, polyfunctional compounds, and the like, as well as mixtures of any two or more thereof. Those of skill in the art recognize that the quantity of bleed control agent employed in the practice of the present invention can vary widely, typically falling in the range of about 0.1 up to about 10 wt. %, relative to the weight of the base formulation.

Fillers traditionally employed for the preparation of resin materials having electrically insulating properties are nonconductive materials such as, for example, aluminum nitride, boron nitride, alumina, silicon dioxide, polytetrafloroethylene and the like. Those of skill in the art readily recognize at the desirability of including filler in the invention composition will depend on the end use contemplated therefor. Thus, for example, when preparing compositions for use as a solder mask, filler is not typically employed. Conversely, when preparing compositions for use as a liquid encapsulant, it is desirable to include substantial quantities of filler therein (typically in the range of about 10 up to 75 wt. % filler, relative to the weight of the base formulation).

While the use of inert diluents is not excluded from the practice of the present invention, it is generally preferred that compositions according to the invention remain substantially free of solvent, so as to avoid the potentially detrimental effects thereof, e.g., creation of voids caused by solvent escape, the environmental impact of vaporized solvent, the redeposition of outgassed molecules in the surface of the article, and the like. When used, suitable inert diluents include dimethylformamide, dimethylacetamide, N-methylpyrrolidone, toluene, xylene, methylene chloride, tetrahydrofuran, glycol ethers, methyl ethyl ketone or monoalkyl or dialkyl ethers of ethylene glycol, polyethylene glycol, propylene glycol, polypropylene glycol, and the like. When used, inert diluents are typically present in the range of about 10 up to 40 wt. %, relative to the weight of the base formulation.

Reactive diluents contemplated for use in the practice of the present invention include any reactive diluent which, in combination with the maleimide-based formulations described herein, forms a thermosetting resin composition. Such reactive diluents include acrylates and methacrylates of monofunctional and polyfunctional alcohols, ethylenically unsaturated compounds, styrenic monomers (i.e., ethers derived from the reaction of vinyl benzyl chlorides with mono-, di-, or trifunctional hydroxy compounds), and the like. When used, reactive diluents are typically present in the range of about 5 up to 25 wt. %, relative to the weight of the base formulation.

In a particular aspect, compositions according to the invention optionally further contain in the range of about 0.1 up to about 10 wt. % of at least one coupling agent, based on the total weight of the composition. Coupling agents contemplated for use in the practice of the present invention include silicate esters, metal acrylate salts, titanates or compounds containing a co-polymerizable group and a chelating ligand.

Adhesion promoters contemplated for use in the practice of the present invention include polymers that have pendant acid or latent acid groups that can increase adhesion. An example is the Ricon R-130 20% maleated (Ricon Resins, Inc., Grand Junction, Colo.), a polybutadiene with anhydride groups that can react with a surface to increase adhesion. When present, adhesion promoters are typically present in the range of about 5 up to 30 wt. %, relative to the weight of the base formulation.

Flexibilizers contemplated for use in the practice of the present invention include branched polyalkanes or polysiloxanes that lower the $T_g$ of the formulation. An example of such a material would be polybutadienes such as the Ricon R-130 as described hereinabove. When present, flexibilizers are typically present in the range of about 15 up to about 60 wt. %, relative to the weight of the base formulation.

Dyes contemplated for use in the practice of the present invention include nigrosine, Orasol blue GN, phthalocyanines, and the like. When used, organic dyes in relatively low amounts (i.e., amounts less than about 0.2 wt. %) provide contrast.

Pigments contemplated for use in the practice of the present invention include any particulate material added solely for the purpose of imparting color to the formulation, e.g., carbon black, metal oxides (e.g., $Fe_2O_3$, titanium oxide), and the like. When present, pigments are typically present in the range of about 0.5 up to about 5 wt. %, relative to the weight of the base formulation.

As readily recognized by those of skill in the art, the quantity of the various components employed to prepare invention compositions can vary within wide ranges. For example, the quantity of the maleimide component typically falls in the range of about 1 up to 99.8 wt. percent of the base formulation, while the quantity of polycyanate ester monomer(s) typically comprise(s) in the range of about 0 up to 98.8 wt. percent of the base formulation, and the curing catalyst typically comprises in the range of about 0.2 up to about 5 wt. percent of the base formulation, wherein wt. percent in all instances is based on the total weight of all components of the base formulation.

In accordance with another embodiment of the present invention, there are provided assemblies comprising a first article permanently adhered to a second article by the adhesive properties of the base formulation described herein. Examples of the types of articles contemplated for preparation in accordance with the present invention include laminated circuit boards (i.e., the first article and the second article are separate layers of a laminate structure), printed wiring boards, and the like.

Examples of the base materials contemplated for use in the preparation of laminates include woven fabrics of various glasses such as E-glass, S-glass, SII-glass, D-glass, quartz glass, and the like, and other inorganic woven fabrics such as alumina paper; woven fabrics made of super heat-resistant resins such as all-aromatic polyamides, polyimides, fluoroplastics, poly(phenylene sulfide), polyetheretherketones, polyetherimides, liquid-crystal polyester resins, and the like; woven fabrics obtained using composite yarns comprising combinations of fibers of the above inorganic materials and fibers of the above super heat-resistant resins; and other woven fabrics including those comprising suitable combinations of the above.

Thus, when maleimide-containing formulations as described herein are used for the preparation of laminates, the quantity of the maleimide component typically falls in the range of about 1 up to about 30 wt. percent of the base formulation, while the quantity of polycyanate ester monomer(s) typically comprise(s) in the range of about 65 up to about 98.8 wt. percent of the base formulation, and the curing catalyst typically comprises in the range of about 0.2 up to about 5 wt. percent of the base formulation, wherein wt. percent in all instances is based on the total weight of all components of the base formulation.

In accordance with yet another embodiment of the present invention, there are provided articles comprising a circuit board having a solder mask deposited thereon, wherein said solder mask is prepared from the composition according to claim 1. Solder masks are widely used in the electronics industry, and are well known to those of skill in the art. Thus, those of skill in the art can readily determine how to use the compositions described herein for such applications.

Thus, when maleimide-containing formulations as described herein are used for the preparation of solder mask, the quantity of the maleimide component typically falls in the range of about 95 up to about 99.8 wt. percent of the base formulation, while polycyanate ester monomer(s) is typically not added. Curing catalyst typically falls in the range of about 0.2 up to about 5 wt. percent of the base formulation, wherein wt. percent in all instances is based on the total weight of all components of the base formulation.

In accordance with yet another aspect of the present invention, there are provided articles comprising an electronic component encased within an aliquot of the above-described maleimide-based composition. For this specific application of invention compositions, it is desirable to include filler therein in order to enhance the rheological properties thereof.

Thus, when maleimide-containing formulations as described herein are used for the preparation of a glob top, the quantity of the maleimide component typically falls in the range of about 15 up to about 40 wt. percent of the base formulation, while the quantity of polycyanate ester monomer(s) typically comprise(s) in the range of about 55 up to about 84.8 wt. percent of the base formulation, and the curing catalyst typically comprises in the range of about 0.2 up to about 5 wt. percent of the base formulation, wherein wt. percent in all instances is based on the total weight of all components of the base formulation.

Alternatively, when maleimide-containing formulations as described herein are used for the preparation of a glob top, a predominantly maleimide-containing formulation can be employed, i.e., the quantity of the maleimide component typically falls in the range of about 95 up to about 99 wt. percent of the base formulation, and the curing catalyst typically falls in the range of about 1 up to about 5 wt. percent of the base formulation, wherein wt. percent in all instances is based on the total weight of all components of the base formulation.

In accordance with another aspect of the present invention, there are provided improved non-hermetic electronic packages, wherein the improvement comprises employing a maleimide-based composition as described herein for each component of the package, i.e., wherein the maleimide contemplated for use herein has the structure I as described hereinabove.

Those of skill in the art recognize that many different electronic packages would benefit from preparation using the hydrophobic maleimide-based resins described herein. Examples of such packages include ball grid arrays, super ball grid arrays, IC memory cards, chip carriers, hybrid circuits, chip-on-board, multi-chip modules, pin grid arrays, chip size packages (CSPs), and the like.

The invention will now be described in greater detail by reference to the following non-limiting examples.

EXAMPLE 1

Manufacturing Method of Prepregs from Resins

In accordance with the invention, bismaleimide-containing formulations can be used for the preparation of prepregs, as follows:

| a. | Formula | |
|---|---|---|
| | Cyanate ester | 85 parts |
| | Bismaleimide | 15 parts |
| | Co(AcAc) | 0.3 parts | b. Warm up the cyanate ester to achieve the desired viscosity (about 85° C.).

c. Concurrently mix Co(AcAc) and bismaleimide at room temperature.

d. Add the bismaleimide/Co(AcAc) mixture to the cyanate ester.

e. Stir the cyanate ester/bismaleimide combination to achieve homogeneity.

f. The prepreg is made by the general hot melt process. The resin is ordinary melted at 80°–110° C.

EXAMPLE 2

Comparison of Moisture Absorption for Different Bismaleimides

Two bismaleimide formulations were prepared and the moisture absorbing properties thereof were investigated.

| Formula A | |
|---|---|
| BMI-X* | 99 parts |
| Dicumyl peroxide | 1 part |

*BMI-X is the bismaleimide derivative of 10,11-dioctyl-1,20-eicosane

Preparation of formula A:

The bismaleimide (BMI-X) and dicumyl peroxide are mixed at room temperature until the dicumyl peroxide is dissolved. 10 grams are measured into a 1 oz. glass jar. The jar is then degassed. After bubble evolution ceased, the jar is placed into a 175° C. oven for about 45 minutes. The sample is considered to be cured after such treatment. Several such samples were prepared, then removed from the jar and quartered for testing.

| Formula B | |
|---|---|
| 4,4'-bismaleimidophenylmethane | 100 parts |

Preparation of formula B:

10 grams of the bismaleimide, 4,4'-bismaleimidophenylmethane, are measured into a 1 oz. glass jar. The jar is placed into a 175° C. oven for about 45 minutes. The sample is considered to be cured after such treatment. Several such samples were prepared, then removed from the jar and quartered for testing.

Tests and Results

Six quarters of each of sample A and sample B are selected. Each quarter is observed to be void and crack free. Each sample is weighed and placed in a holder. The holder is then placed in a pressure cooker. The samples were subjected to 2 atm at 121° C., and the weight gain measured at regular intervals. Results are presented in Table 1.

TABLE 1

| | Percent weight gain | | | |
|---|---|---|---|---|
| Bismaleimide | 0 hr | 48 hr | 96 hr | 144 hr |
| BMI-X* | 0.0 | 0.37 | 0.2 | 0.17 |
| 4,4'-bismaleimido-phenylenemethane | 0.0 | 3.59 | 6.60 | 7.40 |

*BMI-X is the bismaleimide derivative of 10,11-dioctyl-1,20-eicosane

The results presented in Table 1 demonstrate that a resin prepared from a maleimide according to the invention has substantially higher moisture resistance than a less hydrophobic maleimide according to the prior art (i.e., 4,4'-bismaleimidophenylenemethane).

EXAMPLE 3

Effect of a Specific Bismaleimide on the Moisture Absorbing Properties of a Cyanate Ester The following 3 formulations were prepared to test the moisture absorbing properties of combinations of maleimides and cyanate esters. The maleimide used in all instances was the bismaleimide derivative of 10,11-dioctyl-1,20-eicosane, and the cyanate ester used in all instances was the cyanate ester of dicyclopentadiene phenol novolac.

| Formula C | |
|---|---|
| Cyanate ester | 100 parts |
| Co(AcAc) | 0.3 parts |

| Formula D | |
|---|---|
| Cyanate ester | 85 parts |
| BMI-X | 15 parts |
| Co(AcAc) | 0.3 parts |

| Formula E | |
|---|---|
| Cyanate ester | 70 parts |
| BMI-X | 30 parts |
| Co(AcAc) | 0.3 parts |

*BMI-X is the bismaleimide derivative of 10,11-dioctyl-1,20-eicosane

Formulas D and E were prepared as described in Example 1. Formula C was prepared by warming the cyanate ester component til it becomes liquid (~90° C.), and mixing the result with catalyst (i.e., Co(AcAc)).

Each of Formulas C, D and E were poured into a teflon mold. The mold contains 9 cavities, 7/16 of an inch in diameter and ¼ inch deep. The molds are placed in a degassing unit. During degassing, the resin comes out of the mold, thus several applications of material were indicated. After degassing was complete, the molds were placed in a 200° C. oven for 1 hour. The samples were then removed from the molds and imperfections formed during cure were removed employing a suitable abrasive, e.g., sand paper. Five samples were post-cured at 150° C. for 16 hours, weighed, and placed in a pressure cooker (2 atm, 121° C.). Weight gains were then measured at regular intervals.

TABLE 2

| Bismaleimide* | Percent weight gain | | | |
|---|---|---|---|---|
| | 0 hr | 23 hr | 48 hr | 73 hr |
| None | 0.0 | 0.96 | 1.36 | 1.45 |
| 15% BMI-X | 0.0 | 0.88 | 1.17 | 1.17 |
| 30% BMI-X | 0.0 | 0.93 | 1.12 | 1.15 |

*BMI-X is the bismaleimide derivative of 10,11-dioctyl-1,20-eicosane

The results presented in Table 2 demonstrate that a resin prepared from a combination of a maleimide according to the invention plus cyanate ester has improved moisture resistance relative to cyanate ester alone.

While the invention has been described in detail with reference to certain preferred embodiments thereof, it will be understood that modifications and variations are within the spirit and scope of that which is described and claimed.

That which is claimed is:

1. A thermosetting resin composition comprising a base formulation comprising:

(a) a maleimide;

(b) in the range of 0.2 up to 5 wt % of at least one curing catalyst, based on the total weight of the composition;

(c) optionally, at least one polycyanate ester monomer;

(d) optionally, an inert or a reactive diluent; and (e) optionally, up to 10 wt % of at least one coupling agent, based on the total weight of the composition;

wherein said maleimide has the structure:

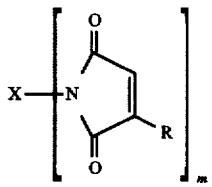

wherein:

m=2 or 3, each R is independently selected from hydrogen or lower alkyl, and

X is a branched chain alkyl or alkylene species having from about 30 to about 500 carbon atoms, and wherein said polycyanate ester has the structure:

$$Y+O-C\equiv N]_q \quad (II)$$

wherein:

q is 1, 2 or 3,

Y is selected from:

saturated straight chain or branched chain alkyl, alkylene or alkylene oxide, optionally containing saturated cyclic moieties as substituents on said alkyl, alkylene or alkylene oxide chain or as part of the backbone of the alkyl, alkylene or alkylene oxide chain, wherein said alkyl alkylene or alkylene oxide species have at least 6 carbon atoms aromatic moieties having the structure:

[(Ar—Q)<sub>r</sub>—Ar]<sub>v</sub>— wherein each Ar is independently, a monovalent, divalent, or trivalent aromatic, substituted aromatic, heteroaromatic or substituted heteroaromatic ring having in the range of 3 up to 10 carbon atoms, Q is alkylene, alkylene, cycloalkylene, cycloalkylene, bicycloalkylene or bicycloalkylene, r falls in the range of 0 up to 6 and v is 1, 2 or 3, as well as mixtures of any two or more thereof.

2. A composition according to claim 1 further comprising one or more of an anti-oxidant, a stabilizer, a bleed control agent, one or more fillers, an adhesion promoter, a flexibilizer, a dye or a pigment.

3. A composition according to claim 1 wherein X is a 10, 11-dioctyl-1,20-eicosyl radical.

4. A composition according to claim 1 wherein said cyanate ester is selected from 1,1-bis(4-cyanatophenyl) methane, 1,1-bis(4-cyanatophenyl)ethane, 2,2-bis(4-cyanatophenyl)propane, 1,3-bis[2-(4-cyanatophenyl) propyl]benzene, the cyanate ester of dicyclopentadiene phenol novolac or 1,1-bis(2,6-dimethyl-4-cyanatophenyl) methane.

5. A composition according to claim 1 wherein:

said maleimide component comprises in the range of about 10 up to 99.8 wt. percent of said base formulation, said polycyanate ester monomer(s) comprise(s) up to 89.8 wt. percent of said base formulation, and said curing catalyst comprises in the range of about 0.2 up to about 5 wt. percent of said base formulation, wherein wt. percent in all instances is based on the total weight of all components of the base formulation.

6. A composition according to claim 1 wherein:

said maleimide component comprises in the range of about 15 up to 30 wt. percent of said base formulation, said polycyanate ester monomer(s) comprise(s) in the range of about 65 up to 84.8 wt. percent of said base formulation, and said curing catalyst comprises in the range of about 0.2 up to about 5 wt. percent of said base formulation, wherein wt. percent in all instances is based on the total weight of all components of the base formulation.

7. A composition according to claim 1 wherein:

said maleimide component comprises in the range of about 95 up to about 99.8 wt. percent of said base formulation, said polycyanate ester monomer(s) is not present, and said curing catalyst comprises in the range of about 0.2 up to about 5 wt. percent of said base formulation, wherein wt. percent in all instances is based on the total weight of all components of the base formulation.

8. A composition according to claim 1 wherein:

said maleimide component comprises in the range of about 15 up to 40 wt. percent of said base formulation, said polycyanate ester monomer(s) comprise(s) in the range of about 55 up to 84.8 wt. percent of said base formulation, and said curing catalyst comprises in the range of about 0.2 up to about 5 wt. percent of said base formulation, wherein wt. percent in all instances is based on the total weight of all components of the base formulation.

9. A composition according to claim 1 wherein:

said maleimide component comprises in the range of about 95 up to about 99 wt. percent of said base formulation, said polycyanate ester monomer(s) is not present, and said curing catalyst comprises in the range of about 1 up to about 5 wt. percent of said base formulation, wherein wt. percent in all instances is based on the total weight of all components of the base formulation.

10. A composition according to claim 1, wherein the optional diluent is selected from dimethylformamide, dimethylacetamide, N-methylpyrrolidone, toluene, xylene, methylene chloride, tetrahydrofuran, glycol ethers, methyl ethyl ketone or monoalkyl or dialkyl ethers of ethylene glycol, polyethylene glycol, propylene glycol or polypropylene glycol.

11. An assembly comprising a first article permanently adhered to a second article by a cured aliquot of the thermosetting resin composition according to claim 1.

12. An assembly according to claim 11 wherein said first article and said second article are separate layers of a laminated circuit board.

13. An article comprising a circuit board having a solder mask deposited thereon, wherein said solder mask is prepared from the composition according to claim 1.

14. In a non-hermetic electronic package, the improvement comprising employing a maleimide-based adhesive composition according to claim 1 for each component of said package.

15. An article comprising an electronic component encased within an aliquot of composition according to claim 1.

* * * * *